US009680232B2

(12) United States Patent
Markish et al.

(10) Patent No.: US 9,680,232 B2
(45) Date of Patent: Jun. 13, 2017

(54) GRADED-GROUND DESIGN IN A MILLIMETER-WAVE RADIO MODULE

(71) Applicant: QUALCOMM Incorporated, San Diego, CA (US)

(72) Inventors: Ofer Markish, Emek Hefer-Beerotaim (IL); Alon Yehezkely, Haifa (IL)

(73) Assignee: QUALCOMM Incorporated, San Diego, CA (US)

( * ) Notice: Subject to any disclaimer, the term of this patent is extended or adjusted under 35 U.S.C. 154(b) by 299 days.

(21) Appl. No.: 14/286,464

(22) Filed: May 23, 2014

(65) Prior Publication Data
US 2014/0253382 A1 Sep. 11, 2014

Related U.S. Application Data

(63) Continuation-in-part of application No. 13/729,553, filed on Dec. 28, 2012.
(Continued)

(51) Int. Cl.
*H01Q 1/48* (2006.01)
*H01Q 21/00* (2006.01)
(Continued)

(52) U.S. Cl.
CPC .......... *H01Q 21/0025* (2013.01); *H01Q 1/48* (2013.01); *H01Q 21/0093* (2013.01);
(Continued)

(58) Field of Classification Search
CPC ...... H01Q 1/38; H01Q 9/0407; H01Q 21/065; H01Q 9/0414; H01Q 1/48; H01Q 21/0025
(Continued)

(56) References Cited

U.S. PATENT DOCUMENTS

| 4,532,518 A | 7/1985 | Gaglione et al. |
| 5,038,146 A | 8/1991 | Troychak et al. |

(Continued)

FOREIGN PATENT DOCUMENTS

| WO | WO-2012074446 A1 | 6/2012 | |
| WO | WO 2012125185 A1 * | 9/2012 | ............... H01Q 1/20 |

(Continued)

OTHER PUBLICATIONS

Yaghmour et al. "Effect of Mutual Coupling Between Signal Traces and Ground Planes on SSO Noise in Packages with Multiple Stacked Ground Planes." IEEE 1997 Electronic Components and Technology Conference, pp. 836-841.*
(Continued)

*Primary Examiner* — Gregory C Issing
(74) *Attorney, Agent, or Firm* — Patterson & Sheridan, L.L.P.

(57) ABSTRACT

A millimeter-wave radio frequency (RF) module is provided. The RF module includes a multilayer substrate having at least a front layer, a back layer, a plurality of middle layers, a first ground layer, and a second ground layer, wherein the first ground layer includes a graded-ground plane having a pair of non-overlapping ground lines connected at a single connection point through a graded connection, and wherein the second ground layer includes a double graded-ground plane having a pair of overlapping ground lines connected at a single connection point through a graded connection, wherein the first ground layer and the second ground layer provide a reference ground to a transmission line included in the multilayer substrate.

17 Claims, 8 Drawing Sheets

Related U.S. Application Data

(60) Provisional application No. 61/827,167, filed on May 24, 2013, provisional application No. 61/643,438, filed on May 7, 2012.

(51) Int. Cl.
*H01Q 21/06* (2006.01)
*H01Q 21/20* (2006.01)
*H01Q 23/00* (2006.01)

(52) U.S. Cl.
CPC ......... *H01Q 21/067* (2013.01); *H01Q 21/205* (2013.01); *H01Q 23/00* (2013.01); *H01L 2224/16225* (2013.01)

(58) Field of Classification Search
USPC ........................................................ 343/829
See application file for complete search history.

(56) References Cited

U.S. PATENT DOCUMENTS

| | | | |
|---|---|---|---|
| 5,384,486 A | 1/1995 | Konno | |
| 6,014,114 A * | 1/2000 | Westfall | H01Q 1/48 343/700 MS |
| 6,452,549 B1 | 9/2002 | Lo | |
| 6,552,687 B1 * | 4/2003 | Rawnick | H01Q 1/38 343/700 MS |
| 6,836,247 B2 * | 12/2004 | Soutiaguine | H01Q 9/0414 343/700 MS |
| 6,870,878 B1 | 3/2005 | Doi et al. | |
| 7,304,605 B2 | 12/2007 | Wells et al. | |
| 7,408,510 B2 * | 8/2008 | Yamamoto | H01Q 1/38 343/700 MS |
| 7,830,312 B2 * | 11/2010 | Choudhury | H01Q 3/26 343/700 MS |
| 7,852,281 B2 * | 12/2010 | Choudhury | H01Q 1/2291 343/700 MS |
| 8,912,957 B2 | 12/2014 | Lin | |
| 2003/0123238 A1 * | 7/2003 | Yu | H05K 1/0218 361/780 |
| 2008/0036668 A1 | 2/2008 | White et al. | |
| 2009/0167611 A1 | 7/2009 | Hsu et al. | |
| 2010/0079343 A1 | 4/2010 | Hsu et al. | |
| 2010/0127941 A1 | 5/2010 | Chiang et al. | |
| 2011/0063169 A1 | 3/2011 | Chen et al. | |
| 2011/0227588 A1 | 9/2011 | Chen et al. | |
| 2012/0235881 A1 | 9/2012 | Pan et al. | |
| 2013/0293420 A1 | 11/2013 | Yehezkely | |
| 2014/0192923 A1 | 7/2014 | Matsuo et al. | |
| 2014/0320344 A1 | 10/2014 | Sanderovich et al. | |

FOREIGN PATENT DOCUMENTS

| | | |
|---|---|---|
| WO | WO-2012125189 A1 | 9/2012 |
| WO | WO-2013018365 A1 | 2/2013 |

OTHER PUBLICATIONS

Orban D., et al., "The Basics of Patch Antennas, Updated," RF Globalnet Newsletter, Sep. 29, 2009, pp. 1-20.

* cited by examiner

US 9,680,232 B2

GRADED-GROUND DESIGN IN A MILLIMETER-WAVE RADIO MODULE

CROSS REFERENCE TO RELATED APPLICATIONS

This application claims the benefit of U.S. Provisional Application No. 61/827,167 filed May 24, 2013. This application is also a continuation-in-part of U.S. patent application Ser. No. 13/729,553 filed Dec. 28, 2012, which claims the benefit of U.S. Provisional Application No. 61/643,438, filed May 7, 2012. The contents of the above-referenced applications are hereby incorporated by reference for all that they contain.

TECHNICAL FIELD

The present invention relates generally to millimeter wave radio frequency (RF) systems and, more particularly, to efficient design of radio modules that increase the number of antennas per module while allowing efficient signal propagation.

BACKGROUND

The 60 GHz band is an unlicensed band which features a large amount of bandwidth and a large worldwide overlap. The large bandwidth means that a very high volume of information can be transmitted wirelessly. As a result, multiple applications, each requiring transmission of large amounts of data, can be developed to allow wireless communication around the 60 GHz band. Examples for such applications include, but are not limited to, wireless high definition TV (HDTV), wireless docking stations, wireless Gigabit Ethernet, and many others.

In order to facilitate such applications there is a need to develop integrated circuits (ICs), such as amplifiers, mixers, radio frequency (RF) analog circuits, and active antennas that operate in the 60 GHz frequency range. An RF system typically comprises active and passive modules. The active modules (e.g., a phased array antenna) require control and power signals for their operation, which are not required by passive modules (e.g., filters). The various modules are fabricated and packaged as radio frequency integrated circuits (RFICs) that can be assembled on a printed circuit board (PCB). The size of the RFIC package may range from several to a few hundred square millimeters.

In the consumer electronics market, the design of electronic devices, and thus RF modules integrated therein, should meet the constraints of minimum cost, size, power consumption, and weight. The design of the RF modules should also take into consideration the current assembled configuration of electronic devices, and particularly handheld devices, such as laptop and tablet computers, in order to enable efficient transmission and reception of millimeter wave signals. Furthermore, the design of the RF module should account for minimal power loss of receive and transmit RF signals and for maximum radio coverage.

A schematic diagram of a RF module 100 designed for transmission and reception of millimeter wave signals is shown in FIG. 1. The RF module 100 includes an array of active antennas 110-1 through 110-N connected to a RF circuitry or IC 120. Each of the active antennas 110-1 through 110-N may operate as transmit (TX) and/or receive (RX) antennas. An active antenna can be controlled to receive/transmit radio signals in a certain direction, to perform beam forming, and for switching from receive to transmit modes. For example, an active antenna may be a phased array antenna in which each radiating element can be controlled individually to enable the usage of beam-forming techniques.

In the transmit mode, the RF circuitry 120 typically performs up-conversion, using a mixer (not shown in FIG. 1), to convert intermediate frequency (IF) signals to radio frequency (RF) signals. Then, the RF circuitry 120 transmits the RF signals through the TX antenna according to the control signal. In the receive mode, the RF circuitry 120 receives RF signals through the active RX antenna and performs down-conversion, using a mixer, to IF signals using the local oscillator (LO) signals, and sends the IF signals to a baseband module (not shown in FIG. 1).

In both receive and transmit modes, the operation of the RF circuitry 120 is controlled by the baseband module using a control signal. The control signal is utilized for functions, such as gain control, RX/TX switching, power level control, beam steering operations, and so on. In certain configurations, the baseband module also generates the LO and power signals and transfers such signals to the RF circuitry 120. The power signals are DC voltage signals that power the various components of the RF circuitry 120. Normally, the IF signals are also transferred between the baseband module and the RF circuitry 120.

In common design techniques, the array of active antennas 110-1 to 110-N are implemented on the substrate upon which the IC of the RF circuitry 120 is also mounted. An IC is fabricated on a multi-layer substrate and metal vias that connect between the various layers. The multi-layer substrate may be a combination of metal and dielectric layers and can be made of materials, such as a laminate (e.g., FR4 glass epoxy, Bismaleimide-Triazine), ceramic (e.g., low temperature co-fired ceramic LTCC), polymer (e.g., polyimide), PTFE (Polytetrafluoroethylene) based compositions (e.g., PTFE/Cermaic, PTFE/Woven glass fiber), and Woven glass reinforced materials (e.g., woven glass reinforced resin), wafer level packaging, and other packaging, technologies and materials. The cost of the multi-layer substrate is a function of the area of the layer; the greater the area of the layer, the greater the cost of the substrate.

Antenna elements of the array of active antennas 110-1 to 110-N are typically implemented by having metal patterns in a multilayer substrate. Each antenna element can utilize several substrate layers. In conventional implementations for millimeter wave communications, antenna elements are designed to occupy a single side of the multi-layer substrate side. This is performed in order to allow the antenna radiation to properly propagate.

For example, a RF module 200 depicted in FIG. 2 includes a multi-layer substrate 210 and a plurality of antenna elements 220 implemented on an upper layer of the substrate 210. The antenna elements 220 are connected to a RF circuitry 230 using traces 201. The RF circuitry 230 performs the function discussed in greater detail above. The RF module 200 may also contain discrete electronic components 240 such as an antenna interface in an implementation of chip-board transition structure, which typically includes the IC (chip) package and transmission lines from the IC to the substrate. Additionally, circuits designed for impedance matching and electrostatic discharge (ESD) protection may also be part of the antenna interface.

The conventional RF designs require implementing the number of active antennas on one side of the substrate, thus providing a constraint that limits the number of antennas of the RF module. An attempt to increase the number of active antennas would require increasing the area of substrate.

Also, such an attempt would require increasing the length of the wires (traces) from the RF circuitry to the antenna elements. Furthermore, simply increasing the number of antenna elements on one side of the multi-layer substrate would limit the performance of the RF module, and may not meet the constraints of an efficient design. Such constraints necessitate that the physical dimensions, the power consumption, heat transfer, and cost should be as minimal possible.

A critical constraint in designing a RF module with multiple active antennas is the ground planes. The ground plane provides a potential reference to RF signals transmit/received by the antennas. Thus, an attempt to design an RF module with a plurality of antennas will not be completed without providing a proper reference ground to each active antenna. A RF module in which the ground planes that do not provide a proper reference to the antennas would causes signal losses.

It would be therefore advantageous to provide an efficient IC layout design for an antenna array connectivity that overcomes the disadvantages of conventional layout design.

SUMMARY

Certain exemplary embodiments disclosed herein include a millimeter-wave radio frequency (RF) module. The RF module comprises a multilayer substrate having at least a front layer, a back layer, a plurality of middle layers, a first ground layer, and a second ground layer, wherein the first ground layer includes a graded-ground plane having a pair of non-overlapping ground lines connected at a single connection point through a graded connection, and wherein the second ground layer includes a double graded-ground plane having a pair of overlapping ground lines connected at a single connection point through a graded connection, wherein the first ground layer and the second ground layer provide a reference ground to a transmission line included in the multilayer substrate.

BRIEF DESCRIPTION OF THE DRAWINGS

The foregoing and other objects, features, and advantages of the invention will be apparent from the following detailed description taken in conjunction with the accompanying drawings.

DETAILED DESCRIPTION

Figure 1:
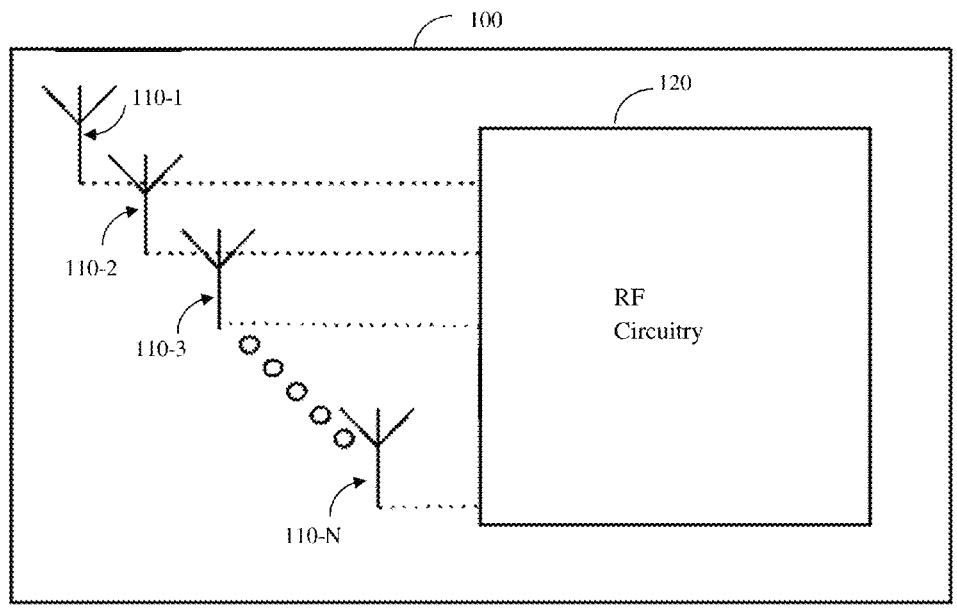
FIG. 1 is a diagram illustrating a RF module with an array of active antennas.
Figure 2:
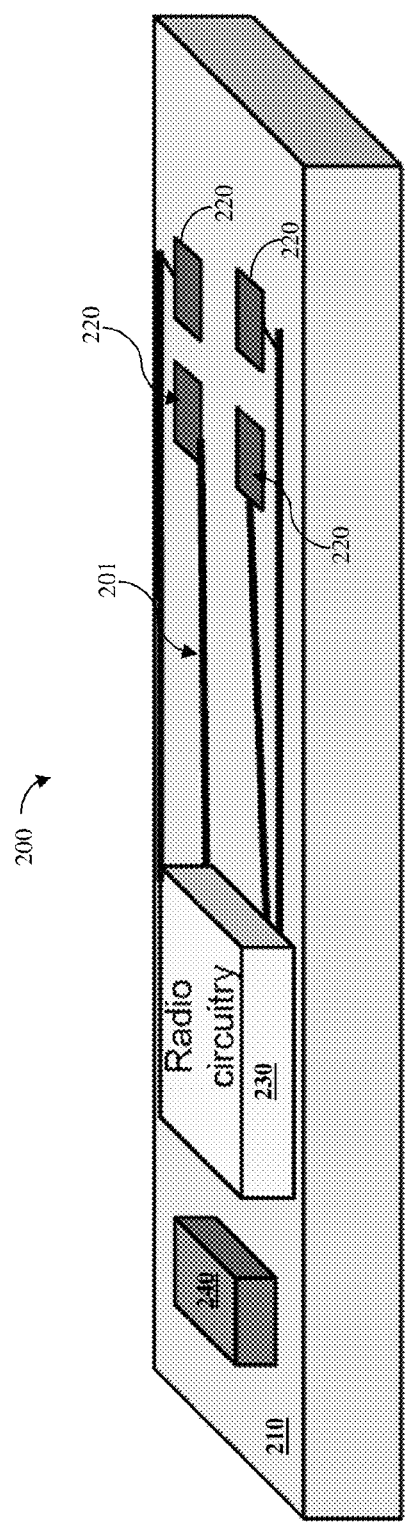
FIG. 2 is a diagram illustrating the assembly of a RF module and a plurality of antenna elements on a multi-layer substrate.

The embodiments disclosed are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

Figure 3:
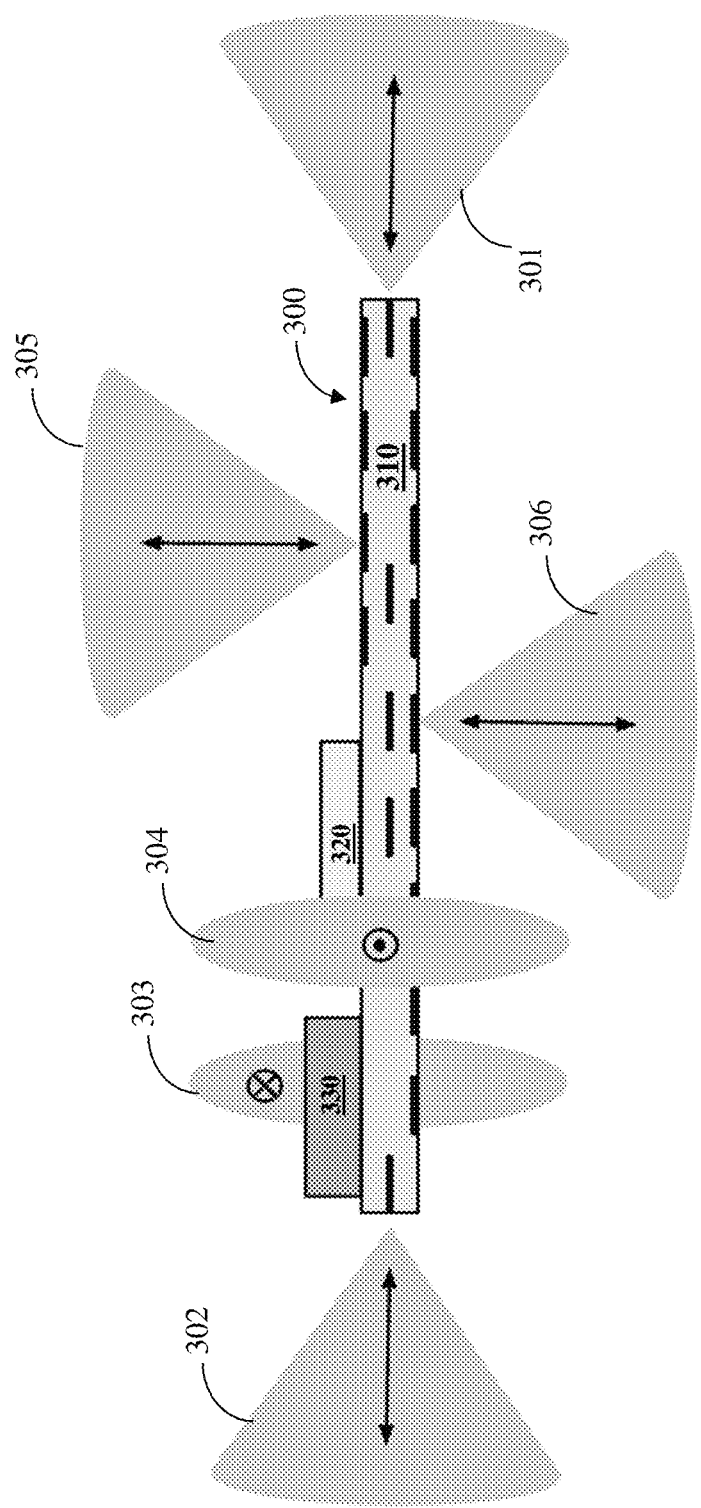
FIG. 3 is a diagram illustrating a radiation pattern of a RFIC constructed according to one embodiment.

FIG. 3 semantically illustrates the radiation patterns of a RF module 300. The RF module 300 packages at least the six antenna sub-arrays (not labeled in FIG. 3), an RF circuitry (e.g., in a form of IC) 320, and discrete electronic components 330 all fabricated on a multilayer substrate 310 of the RF module 300. The sub-array of antennas that form the active antenna array of the module 300 are designed to receive and transmit millimeter wave signals that propagate from four sides, 301, 302, 303, and 304 of the RF module 300. In addition, signals can propagate upward through the upper surface 305 of the RF module 300 and downward through the bottom surface 306 of the RF module 300.

In one configuration, the RF module 300 is installed in electronic devices to provide millimeter wave applications of the 60 GHz frequency band. Examples for such applications include wireless docketing, wireless video transmission, wireless connectivity to storage appliances, and the like. The electronic devices may include, for example, smart phones, mobile phones, tablet computers, laptop computers, and the like.

According to one implementation, each antenna array can be independently controlled by the RF circuitry 320. As a result, signals can be received and/or transmitted through any combination of the six antenna sub-arrays in the RF module 300, thus from any combination of directions. For example, only the antenna sub-arrays in the upper and bottom layers of the substrate 310 can be activated to allow reception and transmission of signals through upward and downward direction, and so on. As will be described below each radiating element in any of the antenna sub-arrays can be independently controlled to further improve and optimize the antenna array in the module 300. It should be noted that each antenna sub-array is configured to transmit and receive millimeter wave signals.

Figure 4:
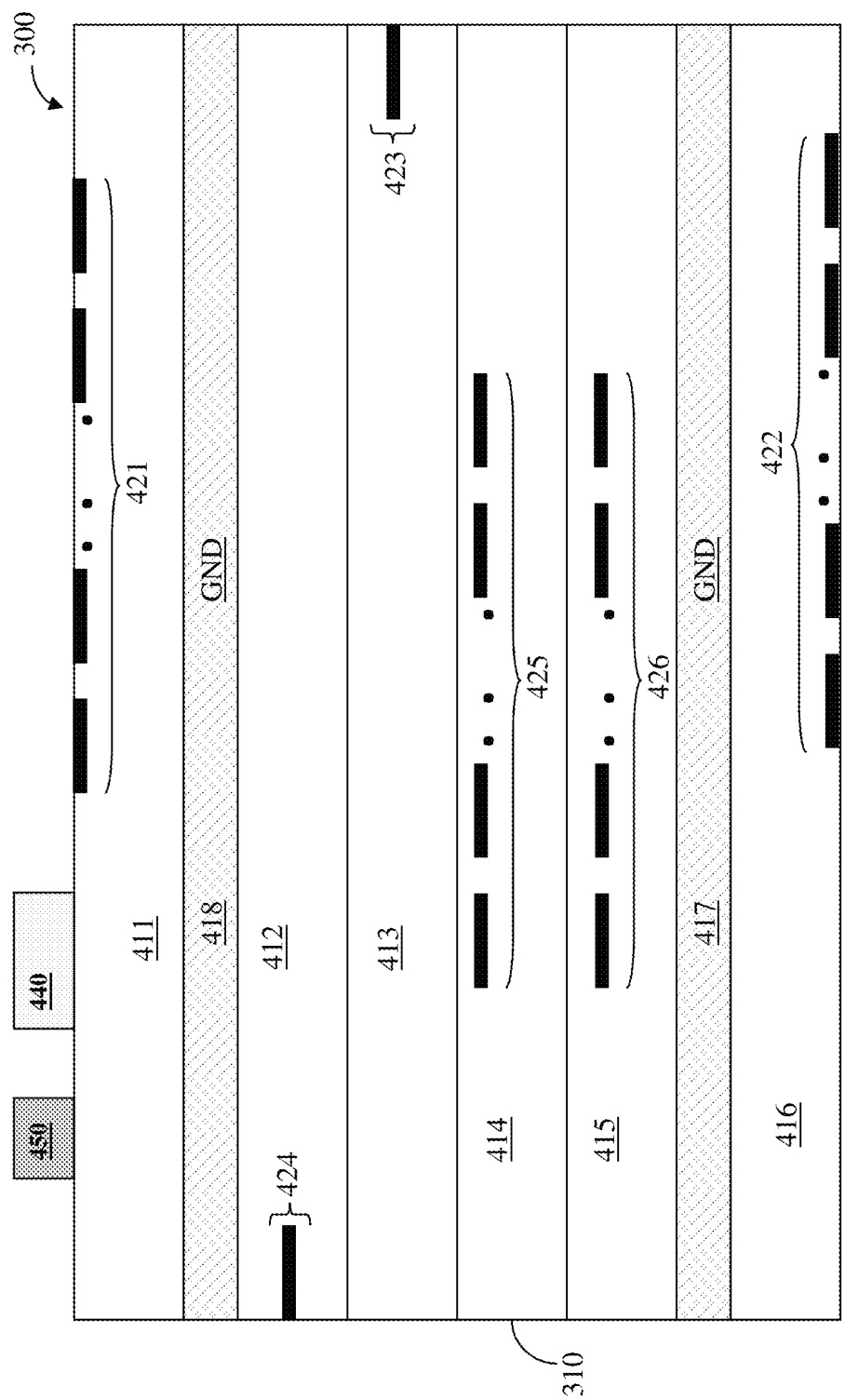
FIG. 4 is a cross-section diagram of the RFIC illustrating the arrangement of the antenna arrays according to one embodiment.

FIG. 4 shows a cross-section diagram of the RF module 300 illustrating the arrangement of the antenna arrays. As illustrated in FIG. 4, the multi-layer substrate 310 of the RF module 300 contains six antenna sub-arrays 421, 422, 423, 424, 425, and 426 which comprise the active antenna array of the RF module 300 and are implemented on different layers of the multi-layer substrate 310. The exemplary multi-layer substrate 310 include 8 layers 411 through 418, wherein each such layer includes sub-layers of dialectic, metal and semiconductor materials that adhere to each other. The sub-layers are not illustrated in FIG. 4.

Specifically, the antenna sub-array 421 is implemented (e.g., printed or fabricated) on a front layer 411 of the substrate 310 and radiates at an upward direction (305, FIG. 3). The antenna sub-array 422 is implemented in the back layer 416 of the substrate 310 and radiates at a downward direction (306, FIG. 6). The antenna sub-arrays 423, 424, 425, and 426 are implemented in any middle layer 412, 413, 414, and 415 of the substrate 310, respectively. In a different implementation, each of the antenna sub-arrays 423, 424, 425, and 426 are implemented at a different layer of the middle layers 412, 413, 414, and 415. In another implementation, two or more of the antenna sub-arrays 423, 424, 425, and 426 can share the same layer of the middle layers 412, 413, 414, and 415.

In an exemplary configuration, antenna sub-arrays 423, 424, 425, and 426 radiate through sides 301, 302, 303, and 304 of the RF module 300, respectively. Each of the antenna sub-arrays 421, 422, 423, 424, 425, and 426 can be an active antenna such as a phased array antenna in which each radiating element can be controlled individually to enable the usage of beam-forming techniques. In addition, the active antenna may be a phased array antenna in which each radiating element can be controlled individually to enable the usage of beam-forming techniques. In a particular embodiment, each of the antenna sub-arrays 421, 422, 423, 424, 425, and 426 can be utilized to receive and transmit millimeter wave signals in the 60 GHz frequency band. As will be described in detail below, the radiating elements of the "side" antenna sub-arrays 423, 424, 425, and 426 are constructed differently than the radiating elements of the antenna sub-arrays 421 and 422 of the front and back layers (411, 416).

As depicted in FIG. 4, also implemented on the multi-layer substrate 310 is the RF circuitry (RFIC) 440 and discrete electronic components 450. The RF circuitry 440 typically performs up-conversion, using a mixer (not shown in FIG. 1), to convert intermediate frequency (IF) signals to radio frequency (RF) signals. Then, the RF circuitry 440 transmits the RF signals through the TX antenna according to the control of the control signal. In the receive mode, the RF circuitry 440 receives RF signals through the active RX antenna and performs down-conversion, using a mixer, to IF signals using the local oscillator (LO) signals, and sends the IF signals to a baseband module. In addition, according to one embodiment, the RF circuitry 440 can control the antenna sub-arrays 421, 422, 423, 424, 425, and 426 independently of each other. This allows achieving higher antenna diversity and optimal coverage at a specific direction. For example, the RF circuitry 440 can switch on the antenna sub-array 421, while switching off the other antenna arrays, and/or switching on the side antenna arrays, and so on. It should be noted that in addition to independently and individually controlling each antenna sub-array, the radiating elements in each antenna sub-array can also be independently controlled. The RF circuitry 440 also controls the phase per antenna in order to establish the beam-forming operation for the phased array antenna.

The discrete electronic components 450 include the components described above. In one embodiment, the RF circuitry components 450 are packaged inside a metal shield (not shown) of the RF module 300. The metal shield adheres to the front layer 411, thus the RF circuitry 440 components 450 are also mounted on the front layer. It should be appreciated that the arrangement of the antenna sub-arrays 421-426 enable maximizing the number of antennas, and thereby maximizing the size of the active antenna array in a millimeter wave RF module, without increasing the area of the RF module or increasing the multi-layer substrate of the RF module.

In the semantic diagram shown in FIG. 4, layers 417 and 418 are ground layers of the RF module 300. The ground layers 417 and 418 serve as reference to the various antennas. In this embodiment, all antenna sub-arrays share either both or one of the ground layers 417 and 418. This allows the RF module 300 to maintain a compact stack-up and to shorten the vertical signal routing, thereby reducing the signal losses through the various antenna arrays. As will be discussed in detail below, according to one embodiment, each of the ground layers 417 and 418 are structured not as a single ground plane, but rather as a graded-ground plane. In one embodiment, each of the layers 417 and 418 are also structured differently. The specific design of the ground layers allows the ground layers to provide a proper transmission reference and impedance matching for each the arrays of antennas, 421, 422, 423, 424, 425, and 426 and a transmission line 510.

According to another embodiment, the ground layers 417 and 418 of the RF module 300 are designed to maintain a compact stack-up and to shorten the vertical signal routing, thereby reducing the signal losses through the various antenna arrays.

It should be noted that in order to minimize the losses involved with the transition from the RF circuitry 440 to a transmission line embedded in an internal layer of the substrate, a ground should be close to the RF circuitry 440. However, this results in a relatively thin substrate available for antenna sub-array 421. A ground reference should be set in sufficient distance from the antenna elements in order to enable adequate bandwidth for operation in the 60 GHz frequency band.

Figure 5:
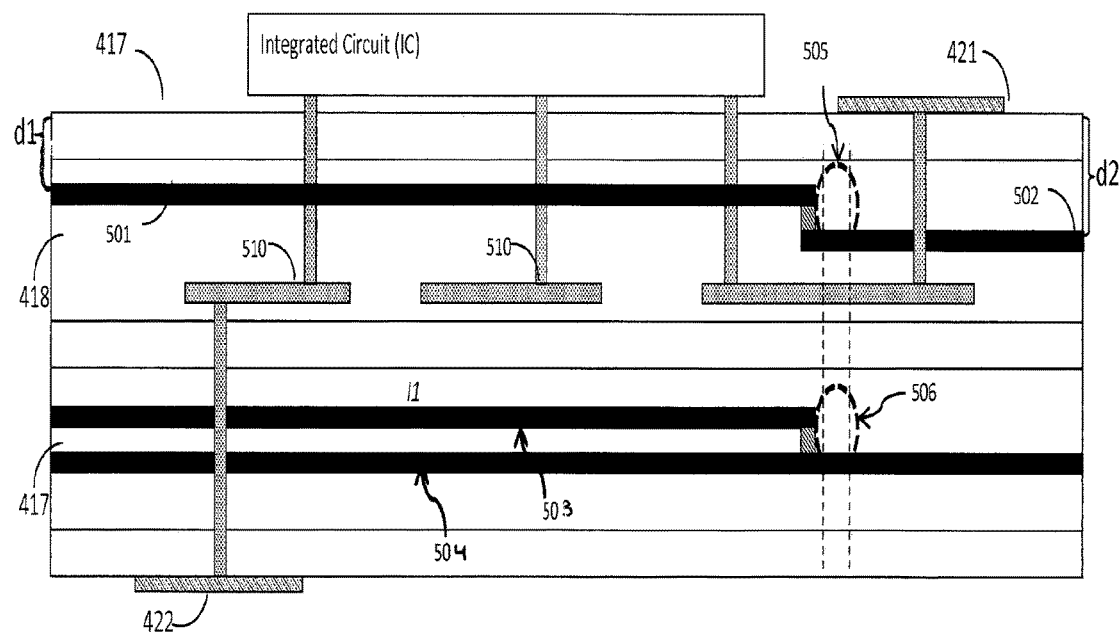
FIG. 5 is a diagram illustrating a graded-ground structure designed according to one embodiment.

FIG. 5 shows a non-limiting and exemplary diagram of ground layers 417 and 418 structured according to one embodiment. In the exemplary substrate depicted in FIG. 4, two ground layers, 417 and 418, are shown. As noted above, antenna sub-arrays 421 through 426 share the same either both or one of the ground layers 417 and 418. For example, the antenna sub-arrays 421 having ground layer 418 as its ground, while the antenna sub-arrays 422 having ground layers 417 as a ground reference.

According to one embodiment, the upper ground layer 418 is structured as a graded-ground plane that includes two ground lines (or sub-layers) 501 and 502, connected (and overlap) only at a connection point 505. The connection between the ground lines 501 and 502 is through a via (not shown in FIG. 5).

Each of the ground lines 501 and 502 has a different distance (d1 and d2) respectively from the upper edge of the front layer 411. The distance of d2 is typically larger than the distance of d1, and the respective values of d1 and d2 are usually determined so as to provide minimal signal losses and impendence matching for at least the antenna sub-arrays surrounding the ground layer 418, for example, sub-arrays 421, 423 and 424. In an exemplary embodiment, to achieve optimal transition performance, the value of d1 is about 3% of the center wavelength of a frequency band, e.g., 60 GHz of the antenna arrays, while the value d2 is about 5% of the center wavelength.

The ground layer 418 is structured as a double graded-ground plane having ground lines (or sub-layers) 503 and 504. The ground lines 503 and 504 of the graded-ground plane overlap each other up to a predefined length l1 and are connected as a graded-ground structure at the connection point 506 through a via (not shown). The overlap length l1 is selected in such a way that it minimizes the impact of the lower ground layer 417 on the antenna sub-array 422.

The structure of the ground layers 417 and 418 provide a reference ground to transmission line 510 in the RF module 300. Specifically, in an embodiment, the transmission line 510 is placed at about the center between the ground lines 501 and 503 or between the ground lines 502 and 504. In the embodiment shown, transmission line 510 is placed between the ground lines 501 and 503. Typically, the transmission line 510 feeds the sub-array of antennas. In an embodiment, the transmission line 510 is a strip line.

Each sub-array antenna is affected by a different ground line of the graded-ground and double graded-ground planes located in proximity to the respective antenna. For example, the antenna sub-arrays 422 and 423 are affected by the ground lines 504 and 502, respectively. Thus, the structure of the disclosed graded-ground planes ensures a reference ground to each of the sub-array antennas located on different sides of the substrate. As the disclosed structure is compact, the signal losses are minimized. The compact structure also reduces the cost of material of the RF module. In addition, the compact structure also enables RFIC assembly on the same side of the antennas, since the connection from the RFIC to the transmission line 510 is has a shorter via as the distance 'd1' is shorter than the distance 'd2'.

In one embodiment, the graded connection points 505 and 506 are aligned with each other. In addition, the graded connection 611 of the transmission line 510 transition is not aligned with the ground graded connection points (505 and 506), but placed within a predefined distance 'd3' (see FIG. 6A) from each. Such structure mitigates transition effects due to the grading connection points (505, 506, and 610).

The design of the ground layers as discussed with reference to FIG. 5 can be utilized in high volume manufacturing and fabrication and does not require complicated operations on the substrate, as only the grading ground lines already included in a substrate utilized in fabrication of RF modules are required. The grading is performed according to the values of d1, d2, d3 and l1 discussed above. The connection of the ground lines is through vias which are included the substrate.

In an embodiment, the substrate in which the graded-ground planes are formed is a multi-layer substrate with metal vias that connect between the various layers. The multi-layer substrate may be a combination of metal and dielectric layers and can be made of materials such as a laminate (e.g., FR4 glass epoxy, Bismaleimide-Triazine), ceramic (e.g., low temperature co-fired ceramic LTCC), polymer (e.g., polyimide), PTFE (Polytetrafluoroethylene) based compositions (e.g., PTFE/Cermaic, PTFE/Woven glass fiber), and Woven glass reinforced materials (e.g., woven glass reinforced resin), wafer level packaging, and other packaging, technologies and materials.

Figure 6A:
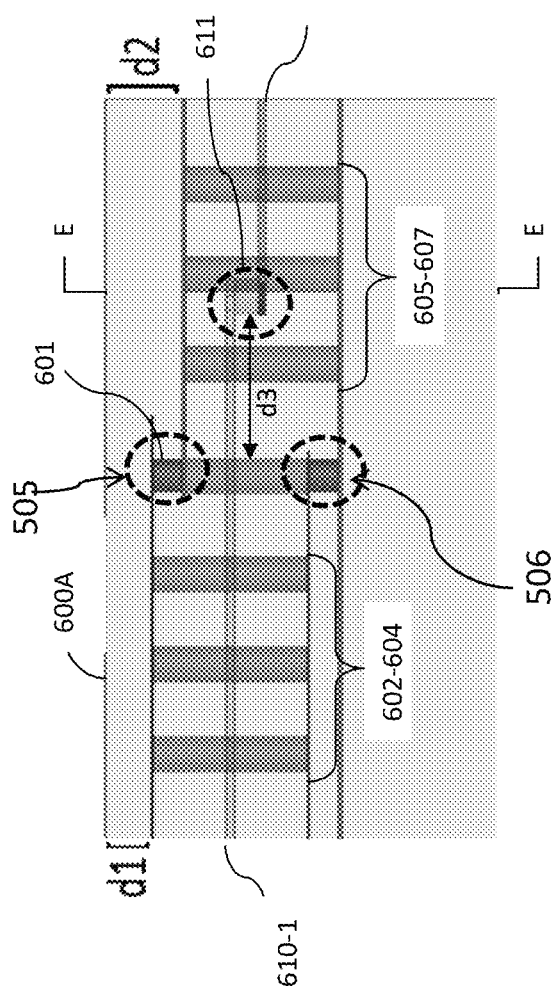
FIGS. 6A and 6B are cross-view diagrams illustrating the graded-ground structure.
Figure 6B:
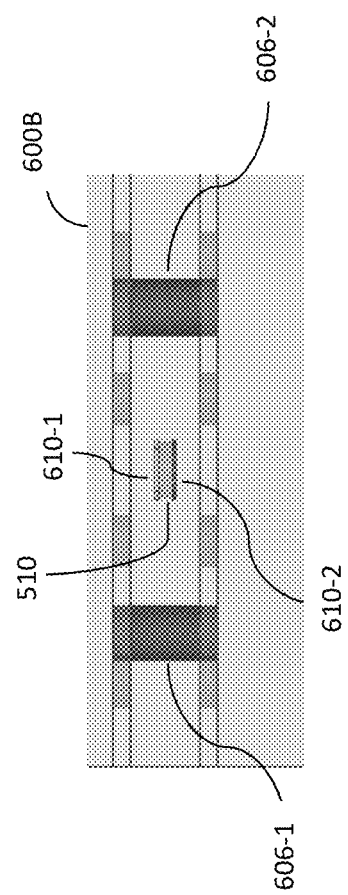

FIGS. 6A and 6B are sectional views of the graded-ground planes depicted in FIG. 5. The sectional view of FIG. 6A is taken along the connection points 505 and 506, and FIG. 6B is taken along the lines 6A-6A, of FIG. 6A. The portions corresponding to those in FIG. 5 are denoted by the same reference numerals and a detailed description thereof is omitted.

FIG. 6A illustrates an exemplary cross-section 600A of graded-ground planes depicted in FIG. 5. As shown in FIG. 6A, the connection points 505 and 506 are connected through via pair 601. In an embodiment, a graded connection is also formed in the transmission line 510, connecting transmission lines 610-1 and 610-2 through a via pair 609. The graded connection of the transmission line is not aligned with the connection points 505 and 506, but rather shifted from such connection points to allow impedance matching of the transmission line. Also illustrated in the section view 6A are via pairs 602 through 607 that are utilized for connecting the two ground planes of layers 417 and 418 to provide a common ground.

FIG. 6B illustrates an exemplary cross-section 600B of graded-ground planes depicted in FIG. 5 taken along line E-E of FIG. 6A. In FIG. 6B, the vias 606-1 and 606-2 of via pair 606 and the ground planes that sandwich the transmission line 510 are shown. The transmission line 510 is graded to transmission lines 610-1 and 610-2.

Figure 6C:
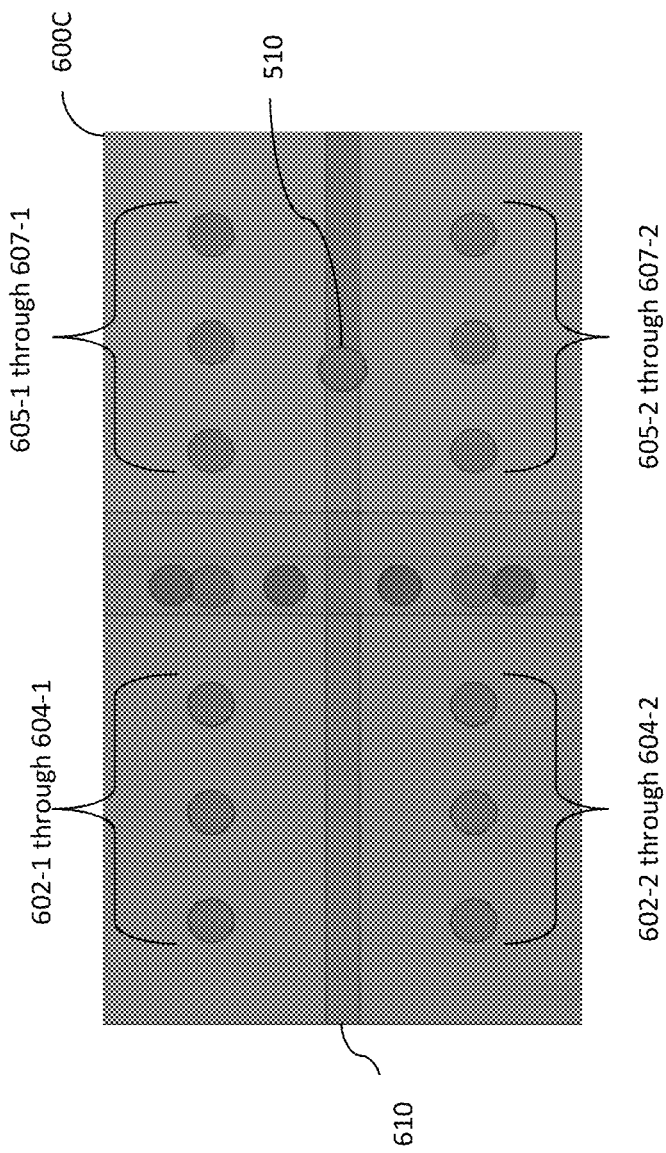
FIG. 6C is a top-view diagram illustrating the graded-ground structure.

FIG. 6C illustrates a top view 600C of graded-ground planes depicted in FIG. 5 taken along of FIG. 6A. The portions corresponding to those in FIG. 5 and FIG. 6A are denoted by the same reference numerals and a detailed description thereof is omitted.

It is important to note that these embodiments are only examples of the many advantageous uses of the innovative teachings herein. Specifically, the innovative teachings disclosed herein can be adapted in any type of consumer electronic device where reception and transmission of millimeter wave signals is needed. Moreover, some statements may apply to some inventive features but not to others. In general, unless otherwise indicated, it is to be understood that singular elements may be in plural and vice versa with no loss of generality.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A millimeter-wave radio frequency (RF) module, comprising:
a multilayer substrate having at least a front layer, a back layer, a plurality of middle layers, a first ground layer, and a second ground layer,
wherein the first ground layer includes a graded-ground plane having a pair of non-overlapping ground lines connected at a single connection point through a graded connection, and wherein the second ground layer includes a double graded-ground plane having a pair of overlapping ground lines connected at a single connection point through a graded connection, wherein the first ground layer and the second ground layer provide a reference ground to a transmission line included in the multilayer substrate.

2. The RF module of claim 1, further comprises:
a first antenna sub-array implemented in the front layer;
a second antenna sub-array implemented in the back layer; and
a plurality of middle antenna sub-arrays implemented in the plurality of the middle layers,
wherein each of the first antenna sub-array, the second antenna sub-array, and the plurality of middle antenna sub-arrays is configured to radiate millimeter-wave signals at a different direction.

3. The RF module of claim 2, wherein the first ground layer is between the front layer and one of the middle layers, and wherein the second ground layer is between the back layer and one of the middle layers.

4. The RF module of claim 2, wherein the double graded-ground plane provides a reference ground to at least the second antenna sub-array.

5. The RF module of claim 2, wherein the graded-ground plane provides a reference ground to at least the first antenna sub-array and the plurality of middle antenna sub-arrays, wherein each of the first antenna sub-array and the plurality of middle antenna sub-arrays is affected by a different ground line of the non-overlapping pair of ground lines.

6. The RF module of claim 1, wherein a first ground line of the non-overlapping pair of ground lines is at a first distance from the front layer and a second ground line of the non-overlapping pair of ground lines is at a second distance from the front layer, wherein the first distance is shorter than the second distance.

7. The RF module of claim 6, wherein values for the first distance and the second distance are based on a center wavelength of a frequency band of the antenna sub-arrays.

8. The RF module of claim 6, wherein the frequency band is at least 60 GHz.

9. The RF module of claim 8, wherein a first ground line of the pair of the overlapping pair of ground lines overlaps a second ground line of the pair of overlapping pair ground lines for a first length, wherein the first length is shorter than a length of the second ground line.

10. The RF module of claim 9, wherein values of the first distance, the second distance, and the first length are selected to impedance match the transmission line.

11. The RF module of claim 1, wherein the single connection points of the graded-ground plane and the double graded-ground plane are aligned with each other.

12. The RF module of claim 11, wherein each of the graded connections is through at least one via in the multi-layer substrate.

13. The RF module of claim 2, further comprises RF circuitry configured to independently control the first antenna sub-array, the second antenna sub-array, and each of the plurality of middle antenna sub-arrays.

14. The RF module of claim 13, further comprises discrete electronic components providing a chip-board transition structure, wherein the RF circuitry and the discrete electronic components are mounted on the front layer of the multi-layer substrate.

15. The RF module of claim 1, wherein the first ground layer and the second ground layer are common.

16. The RF module of claim of 15, wherein each of the front layer, the back layer, and the middle layers is a combination of metal and dielectric layers.

17. The RF module of claim 16, wherein the front layer, the back layer, and the middle layers can be made of a material including at least one of: a laminate material, a ceramic material, a polymer material, a PTFE (Polytetrafluoroethylene) based composition, and a Woven glass reinforced material.

* * * * *